United States Patent
Akiyama et al.

(10) Patent No.: US 7,943,459 B2
(45) Date of Patent: May 17, 2011

(54) SEMICONDUCTOR DEVICE AND METHOD OF MANUFACTURING THE SEMICONDUCTOR DEVICE

(75) Inventors: Kazutaka Akiyama, Matsudo (JP); Takaya Matsushita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 788 days.

(21) Appl. No.: 11/892,635

(22) Filed: Aug. 24, 2007

(65) Prior Publication Data
US 2008/0054395 A1 Mar. 6, 2008

(30) Foreign Application Priority Data
Aug. 30, 2006 (JP) ................................. 2006-234241

(51) Int. Cl.
*H01L 21/8238* (2006.01)
*H01L 21/336* (2006.01)
*H01L 21/425* (2006.01)

(52) U.S. Cl. ........ 438/209; 438/296; 438/528; 438/529; 438/774; 257/E21.66; 257/E21.661; 257/E21.646; 257/E21.645

(58) Field of Classification Search ............. 257/E21.66, 257/E21.661, E21.646, E21.645
See application file for complete search history.

(56) References Cited

U.S. PATENT DOCUMENTS

| | | | | |
|---|---|---|---|---|
| 6,207,545 B1 * | 3/2001 | Lin | ............................... | 438/597 |
| 6,285,540 B1 * | 9/2001 | Lee et al. | ....................... | 361/104 |
| 6,288,436 B1 * | 9/2001 | Narayan et al. | ................ | 257/529 |
| 6,300,233 B1 * | 10/2001 | Lee et al. | ....................... | 438/601 |
| 6,911,386 B1 | 6/2005 | Lee et al. | | |
| 6,951,781 B2 | 10/2005 | Omura et al. | | |
| 7,067,896 B2 * | 6/2006 | Wu et al. | ......................... | 257/529 |
| 2005/0156276 A1 * | 7/2005 | Sakoh | ............................. | 257/529 |
| 2008/0081454 A1 * | 4/2008 | Sakoh | ............................. | 438/601 |

FOREIGN PATENT DOCUMENTS

| | | | |
|---|---|---|---|
| JP | 2001-60586 | * | 3/2001 |
| JP | 2001-274247 | | 10/2001 |
| JP | 2004-111420 | * | 4/2004 |
| JP | 2004-228605 | * | 8/2004 |
| JP | 2005-203688 | * | 7/2005 |

OTHER PUBLICATIONS

Seta et al., English Machine Translated of JP Publication No. 2001-274247, Oct. 5, 2001; (Machine Translated Sep. 29, 2010).*
Notification of Reasons for Rejection issued by the Japanese Patent Office on Jan. 30, 2009, for Japanese Patent Application No. 2006-234241, and English-language translation thereof.*

* cited by examiner

*Primary Examiner* — Charles Garber
*Assistant Examiner* — Mohsen Ahmadi
(74) *Attorney, Agent, or Firm* — Finnegan, Henderson, Farabow, Garrett & Dunner, L.L.P.

(57) ABSTRACT

A semiconductor device is provided with a conductor wire and a fuse wire formed in an insulating film over a semiconductor substrate, a first under-pad-wire insulating film formed above the insulating film, a second under-pad-wire insulating film formed on the first under-pad-wire insulating film, a pad wire formed in an area above the conductive wire, in the first and second under-pad-wire insulating films and an opening formed by leaving a part of the first under-pad-wire insulating film in an area above the fuse wire, in the first and second under-pad-wire insulating films, wherein the second under-pad-wire insulating film comprises an element different from that of the first under-pad-wire insulating film.

6 Claims, 11 Drawing Sheets

SEMICONDUCTOR DEVICE AND METHOD OF MANUFACTURING THE SEMICONDUCTOR DEVICE

CROSS-REFERENCE TO RELATED APPLICATION

This application is based upon and claims the benefit of priority from the prior Japanese Patent Application No. 2006-234241, filed on Aug. 30, 2006; the entire contents of which are incorporated herein by reference.

BACKGROUND OF THE INVENTION

The present invention relates to a semiconductor device and a method of manufacturing the semiconductor device and, particularly, to a semiconductor device having insulating films of a multilayer structure on a fuse wire and a method of manufacturing the semiconductor device.

As a technology of repairing a failure occurring in a circuit such as a DRAM or SRAM by a redundancy circuit, a technology of using a part of a metal wire as a fuse wire is known. In this case, a laser beam is used to cut the fuse wire and remove an insulating film above the fuse wire. To properly perform both of the cutting and removing, conditions (wavelength, output time, and the like) of a laser beam have to be set properly.

However, even when conditions of a laser beam are set properly, it is difficult to properly perform both of the cutting and removing due to dispersions in the thickness of the insulating film above the fuse wire.

To solve the problem, a method of reducing the influence on the cutting and removing of the dispersions in the thickness of the insulating film above the fuse wire can be considered.

However, in the case where the insulating film above the fuse wire is too thin, a problem arises such that a crack occurring in a device verification test extends from an aluminum (Al) pad wire to a wire just below the pad wire. The test is conducted by making a needle of a tester come into contact with a terminal via on a pad wire (a test for verifying electrical operation of the semiconductor device).

In hot and humid environments, there is a problem such that the wiring material just below the pad wire corrodes due to moisture entering from the crack.

Therefore, although the pad wire and the insulating film of the wire just below the pad wire are desirably thick, it is simultaneously necessary to reduce the influence on the laser beam by reducing dispersions in the film thickness.

There is another known technology. As shown in FIG. 7 of Japanese Patent Application Laid-open Publication No. 2001-274247, a thick insulating film (an Si oxide 13, an SOG film 14, and an Si oxide 15) of a multilayer structure made of two or more materials is formed on a fuse wire 12a. By controlling etching time, the etching is stopped in the surface of the silicon oxide 13. In such a manner, the insulating film on the fuse wire 12a is thinned.

However, generally, the thicker the film is, the more etching dispersions. In the case where the dispersions occur in the etching of the SOG film 14, a part of the SOG film 14 remains on the surface of the silicon oxide 13. As a result, dispersions occur in the film thickness above the fuse wire 12a.

Since the energy absorption amount of the laser beam of the SOG film 14 remained is different from that of the silicon oxide 13, it is difficult to properly cut the fuse wire 12a.

The remained SOG film 14 causes a crack in the Si oxide 11 by a shock of blowing off the insulating film (the Si oxide 11 and the silicon oxide 13) around the fuse wire 12a at the time of cutting the fuse wire 12a.

Consequently, in the conventional technology and Japanese Patent Application Laid-open Publication No. 2001-274247, the thick insulating film above the fuse wire cannot be uniformly thinned by etching.

SUMMARY OF THE INVENTION

According to the first aspect of the present invention, there is provided a semiconductor device, comprising a conductor wire and a fuse wire formed in an insulating film over a semiconductor substrate, a first under-pad-wire insulating film formed above the insulating film, a second under-pad-wire insulating film formed on the first under-pad-wire insulating film, a pad wire formed in an area above the conductive wire, in the first and second under-pad-wire insulating films and an opening formed by leaving a part of the first under-pad-wire insulating film in an area above the fuse wire, in the first and second under-pad-wire insulating films, wherein the second under-pad-wire insulating film comprises an element different from that of the first under-pad-wire insulating film.

According to the second aspect of the present invention, there is provided a method of manufacturing a semiconductor device, comprising the steps of forming an insulating film on a semiconductor substrate, forming a conductor wire and a fuse wire in the insulating film, forming a first under-pad-wire insulating film above the insulating film, forming a second under-pad-wire insulating film on the first under-pad-wire insulating film, the second under-pad-wire insulating film being made of an element different from that of the first under-pad-wire insulating film, forming a pad wire in an area above the conductive wire, in the first and second under-pad-wire insulating films and forming an opening by removing a part of the first under-pad-wire insulating film and the second under-pad-wire insulating film in an area above the fuse wire.

DETAILED DESCRIPTION OF THE INVENTION

Embodiments of the present invention will be described hereinbelow with reference to the drawings. The following description relates to an embodiment of the present invention and does not limit the scope of the present invention.

First Embodiment

Figure 1:
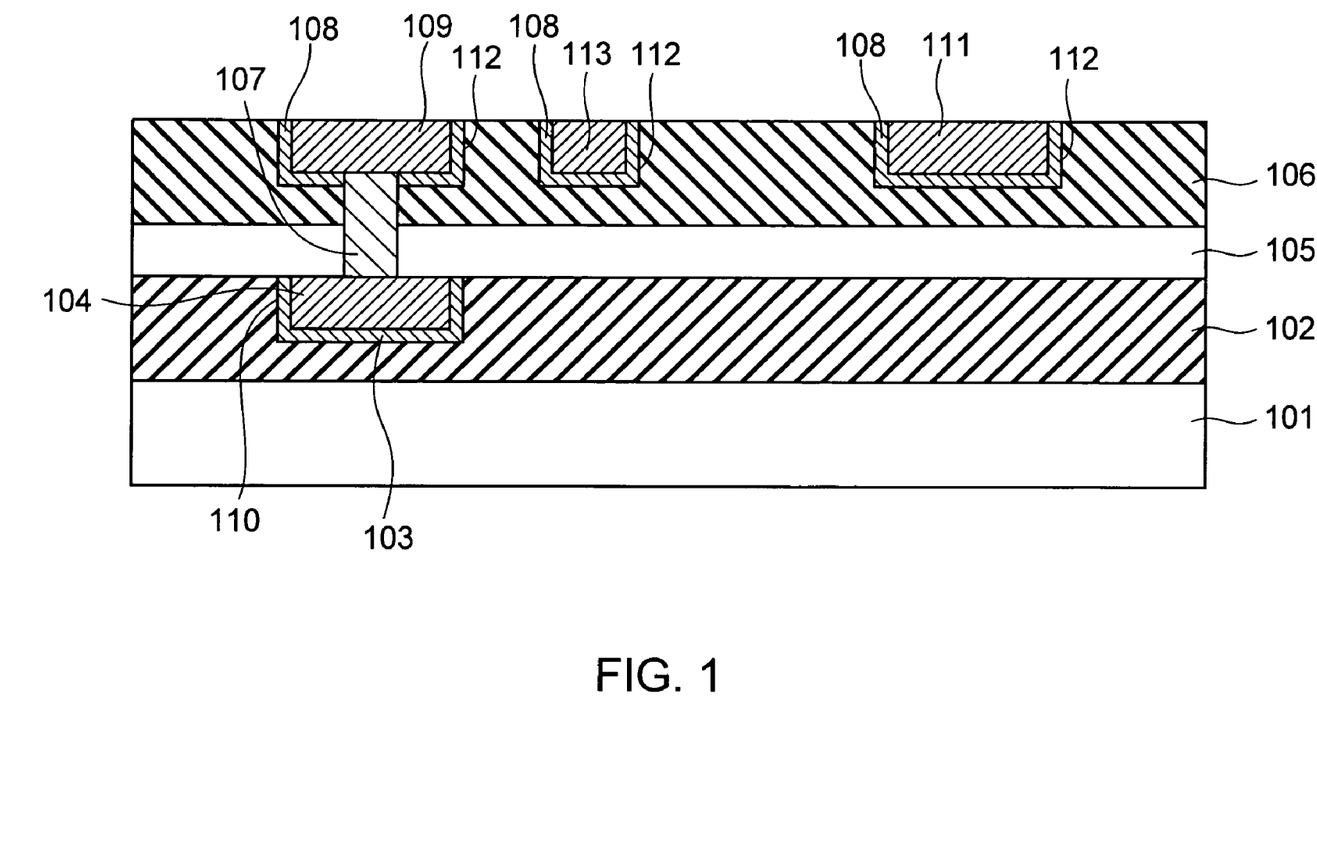
FIG. 1 illustrates a cross section showing a process in a method of manufacturing a semiconductor device according to the first embodiment of the present invention.

FIG. 1 illustrates a cross section showing a process in a method of manufacturing a semiconductor device according to the first embodiment of the present invention.

First, a first insulating film 102 is formed on a semiconductor substrate 101 by chemical vapor deposition (CVD). The first insulating film 102 is a silicon oxide ($SiO_2$ film) and has a thickness of 0.5 μm. For example, the semiconductor substrate 101 is a silicon (Si) substrate.

A trench 110 is formed in the first insulating film 102 by reactive ion etching (RIE). The depth of the trench 110 is 0.4 μm.

A barrier metal 103 is formed on the bottom face and the side face of the trench 110 and on the first insulating film 102. The material of the barrier metal 103 is tantalum (Ta) and the thickness is 0.01 μm.

A copper (Cu) film is formed on the barrier metal 103 by electroplating. The thickness of the Cu is 1 μm.

By selectively removing Cu and the barrier metal 103 other than the trench 110 by chemical mechanical polishing CMP, a conductor wire 104 is formed in the first insulating film 102.

The above process is a damascene process.

Subsequently, a first stopper insulating film 105 for preventing oxidation of the conductor wire 104 is formed on the first insulating film 102 by CVD. The first stopper insulating film 105 is a silicon nitride (SiN) and has a thickness of 0.1 μm.

A second insulating film 106 is formed on the first stopper insulating film 105 by CVD. The second insulting film 106 is a $SiO_2$ and has a thickness of 1.0 μm.

A trench 112 and a via contact (via) 107 are formed in the second insulating film 106 and the first stopper insulating film 105 by RIE. The via 107 is formed as follows. Only the second insulating film 106 is processed by RIE to form the trench 112, and, finally, the first stopper insulating film 105 is processed by RIE to form a contact hole on the conductor wire 104. The depth of the trench 112 is 0.5 μm. The trench 112 is formed in a portion in which a fuse wire 111 will be formed above the conductor wire 104 in the following process.

A barrier metal 108 is formed by sputtering on the bottom face and the side face of the trench 112 and on the second insulating film 106. The material of the barrier metal 108 is tantalum nitride/tantalum (TaN/Ta) and the thickness is 0.01 μm.

A Cu film is formed on the barrier metal 108 by electroplating. The thickness of the Cu film is 1 μm.

By selectively removing Cu and the barrier metal 108 other than the trench 112 by CMP, conductor wires 109 and 113 and the fuse wire 111 are simultaneously formed in the second insulating film 106. The conductor wire 104 formed in the first insulating film 102 and the conductor wire 109 formed in the second insulating film 106 are connected to each other via the via 107.

Alternatively, the conductor wire 113 may be formed in the first insulating film 102.

The above process is a dual-damascene process.

As the material of the conductor wires 104 and 109 and the fuse wire, Al, tin (Sn), lead (Pb), silver (Ag), manganese (Mn) or tungsten (W) may be substituted for Cu.

The conductor wires 104 and 109 are not limited to metal wires of a metal such as Cu but may be semiconductor such as polysilicon.

Figure 2:
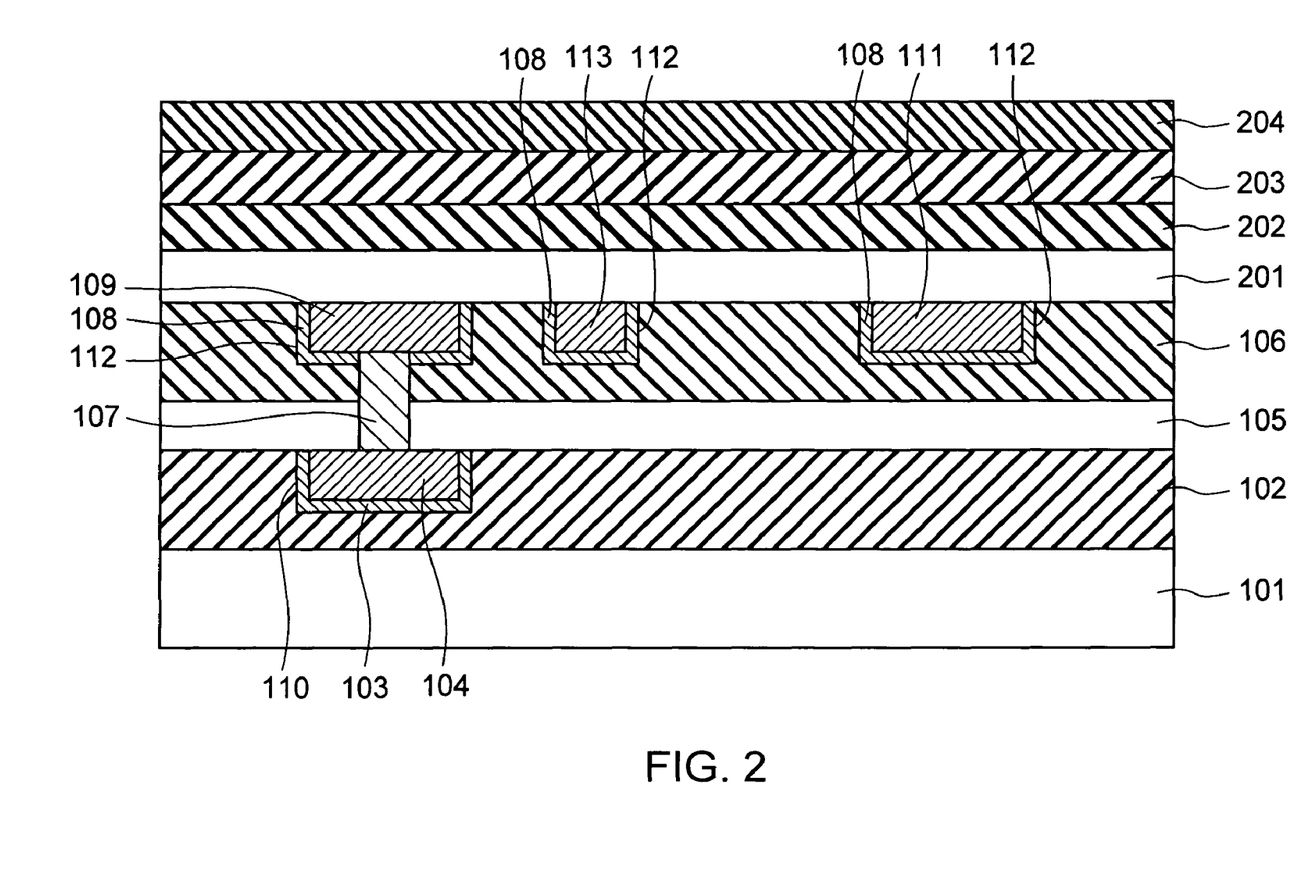
FIG. 2 illustrates a cross section showing a process subsequent to FIG. 1 of the method of manufacturing the semiconductor device according to the first embodiment of the present invention.

FIG. 2 illustrates a cross section showing a process subsequent to process step shown in FIG. 1 of the method of manufacturing the semiconductor device according to the first embodiment of the present invention.

Subsequent to FIG. 1, a second stopper insulating film 201 for preventing oxidation of the conductor wires 109 and 113 and the fuse wire 111 is formed on the second insulating film 106 by CVD. The second stopper insulating film 201 is a SiN and has a thickness of 0.1 μm.

A first insulating film 202 under a pad wire (hereinbelow, first under-pad-wire insulating film 202) is formed on the second stopper insulating film 201 by CVD. The first under-pad-wire insulating film 202 is a $SiO_2$ film and has a thickness of 0.5 μm.

A second insulating film 203 under a pad wire (hereinbelow, second under-pad-wire insulating film 203) is formed on the first under-pad-wire insulating film 202 by CVD. The second under-pad-wire insulating film 203 is a SiN and has a thickness of 0.5 μm.

A third insulating film 204 under a pad wire (hereinbelow, third under-pad-wire insulating film 204) is formed on the second under-pad-wire insulating film 203 by CVD. The third under-pad-wire insulating film 204 is a $SiO_2$ and has a thickness of 0.5 μm.

The material of the first, second and third under-pad-wire insulating films 202, 203 and 204 is, in the case of an inorganic insulating film, for example, $SiO_2$, SiN, $SiH_4$, SiC, SiCN, SiCH, SiOC, or SiOCH and is, in the case of an organic insulating film, for example, polyallyl ether (PAE). The second under-pad-wire insulating film 203 comprises one of them, which is different from that of the first and third under-pad-wire insulating film 202 and 204.

Figure 3:
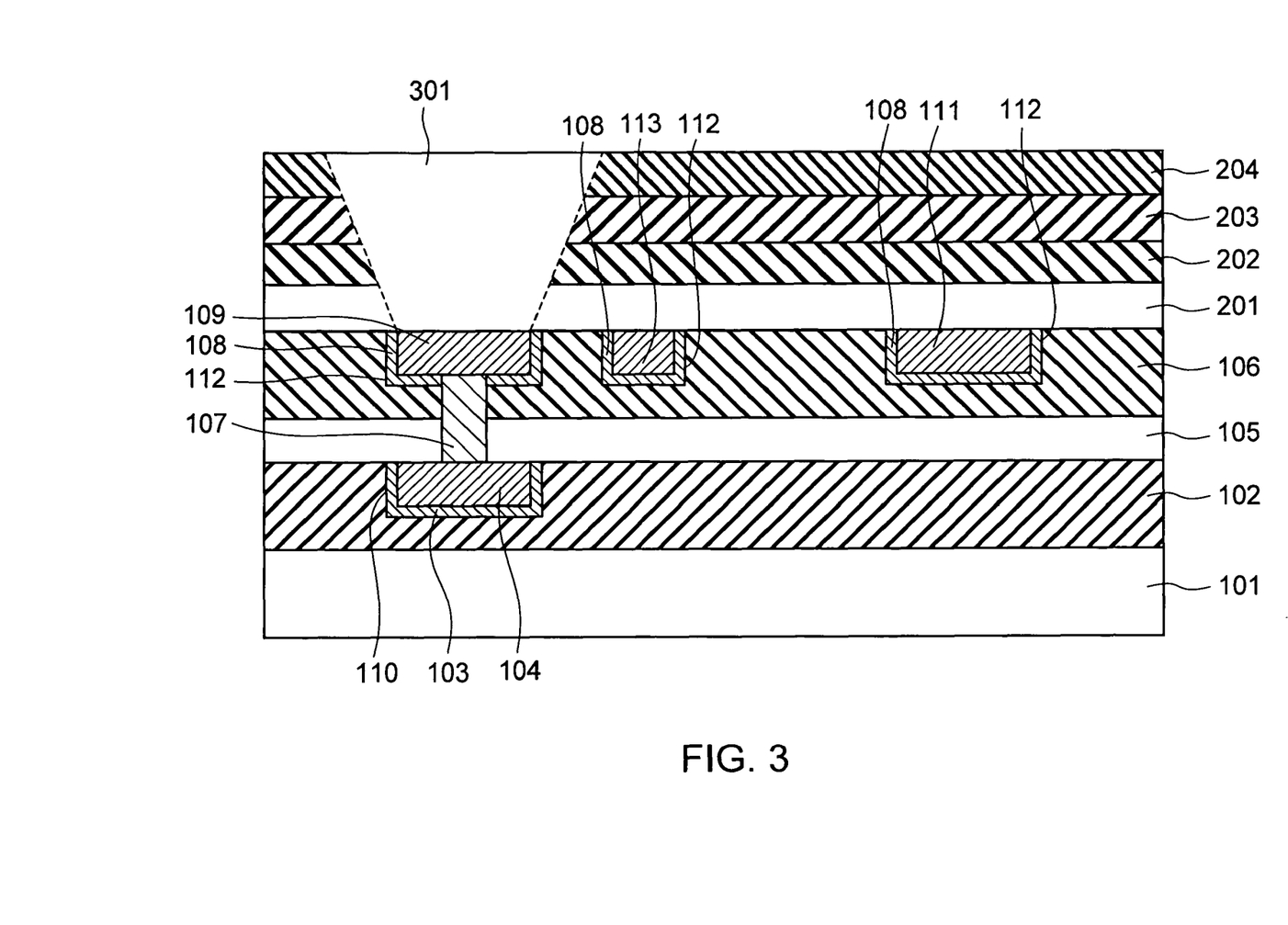
FIG. 3 illustrates a cross section showing a process subsequent to FIG. 2 of the method of manufacturing the semiconductor device according to the first embodiment of the present invention.

FIG. 3 illustrates a cross section showing a process subsequent to process step shown in FIG. 2 of the method of manufacturing the semiconductor device according to the first embodiment of the present invention.

Subsequent to FIG. 2, a resist pattern to expose the conductor wire 109 is formed by photolithography. After that, the third under-pad-wire insulating film 204, the second under-pad-wire insulating film 203, the first under-pad-wire insulating film 202 and the second stopper insulating film 201 are selectively removed by RIE, thereby forming a contact hole 301 so that the conductor wire 109 is exposed. The depth of the contact hole is 1.6 μm.

Figure 4:
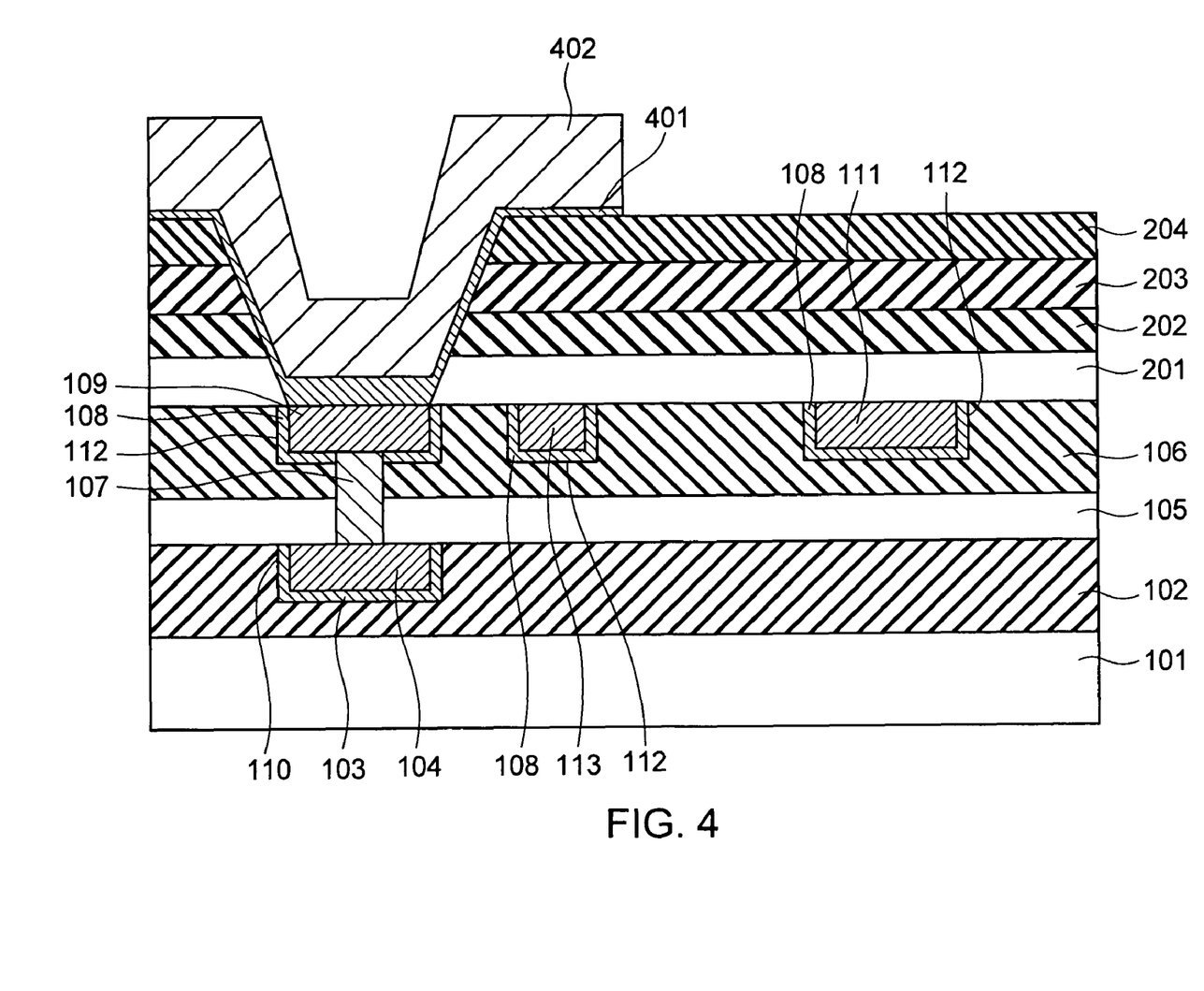
FIG. 4 illustrates a cross section showing a process subsequent to FIG. 3 of the method of manufacturing the semiconductor device according to the first embodiment of the present invention.

FIG. 4 illustrates a cross section showing a process subsequent to process step shown in FIG. 3 of the method of manufacturing the semiconductor device according to the first embodiment of the present invention.

Subsequent to FIG. 3, a barrier metal 401 is formed on the bottom and the side face of the contact hole 301 and on the third under-pad-wire insulating film 204. The material of the barrier metal 401 is a titanium nitride (TiN) and has a thickness of 0.2 μm.

An Al film is formed on the barrier metal 401. After that, the Al film is removed by dry etching so that a pad wire 402 is formed. The thickness of the Al film is 1.5 μm.

Figure 5:
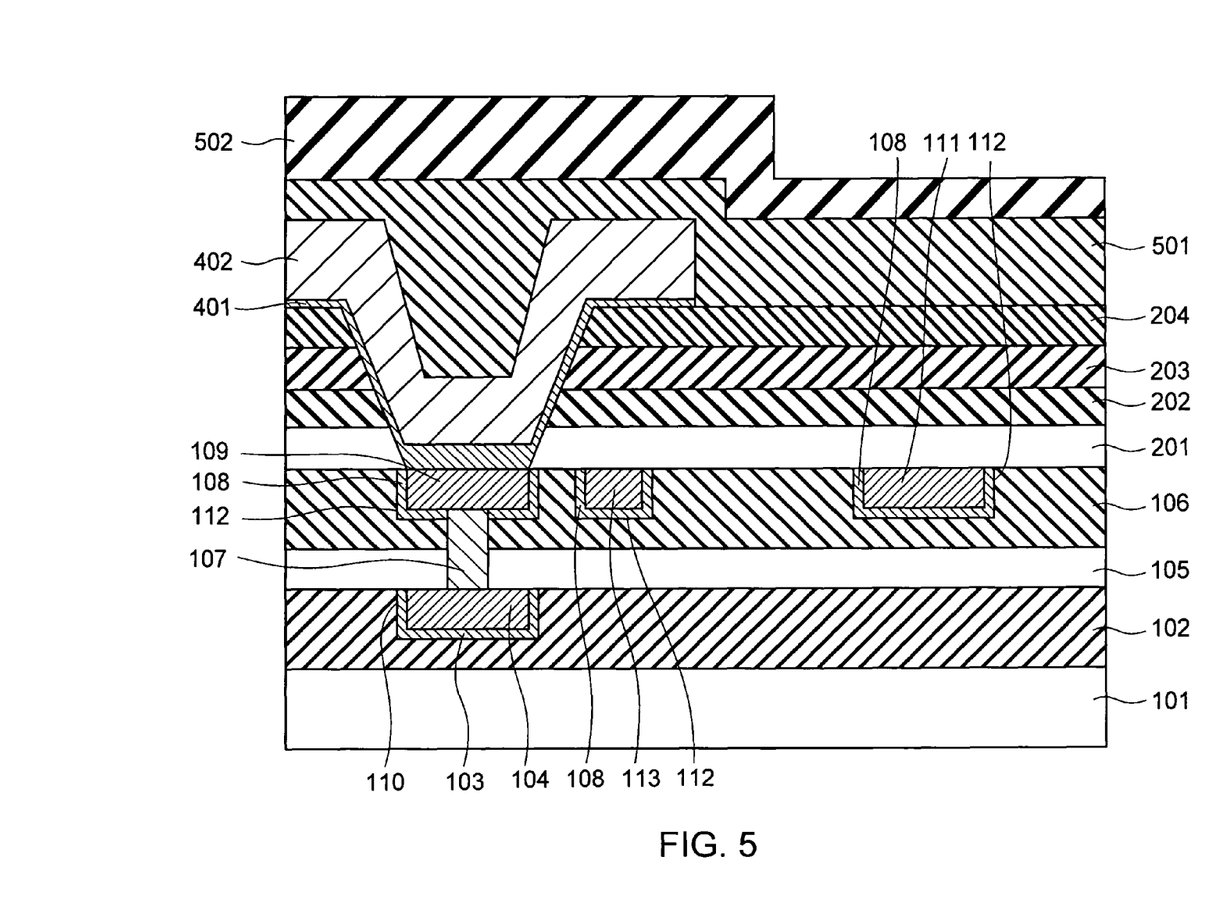
FIG. 5 illustrates a cross section showing a process subsequent to FIG. 4 of the method of manufacturing the semiconductor device according to the first embodiment of the present invention.

FIG. 5 illustrates a cross section showing a process subsequent to process step shown in FIG. 4 of the method of manufacturing the semiconductor device according to the first embodiment of the present invention.

Subsequent to FIG. 4, a first insulating film 501 over a pad wire (hereinbelow, first over-pad-wire insulating film 501) is formed on the whole surface by CVD. The first over-pad-wire insulating film 501 is a $SiO_2$ film and has a thickness of 0.5 μm.

A second insulating film 502 over a pad wire (hereinbelow, second over-pad-wire insulating film 502) is formed on the first over-pad-wire insulating film 501 by CVD. The second over-pad-wire insulating film 502 is a SiN and has a thickness of 0.5 μm.

Figure 6:
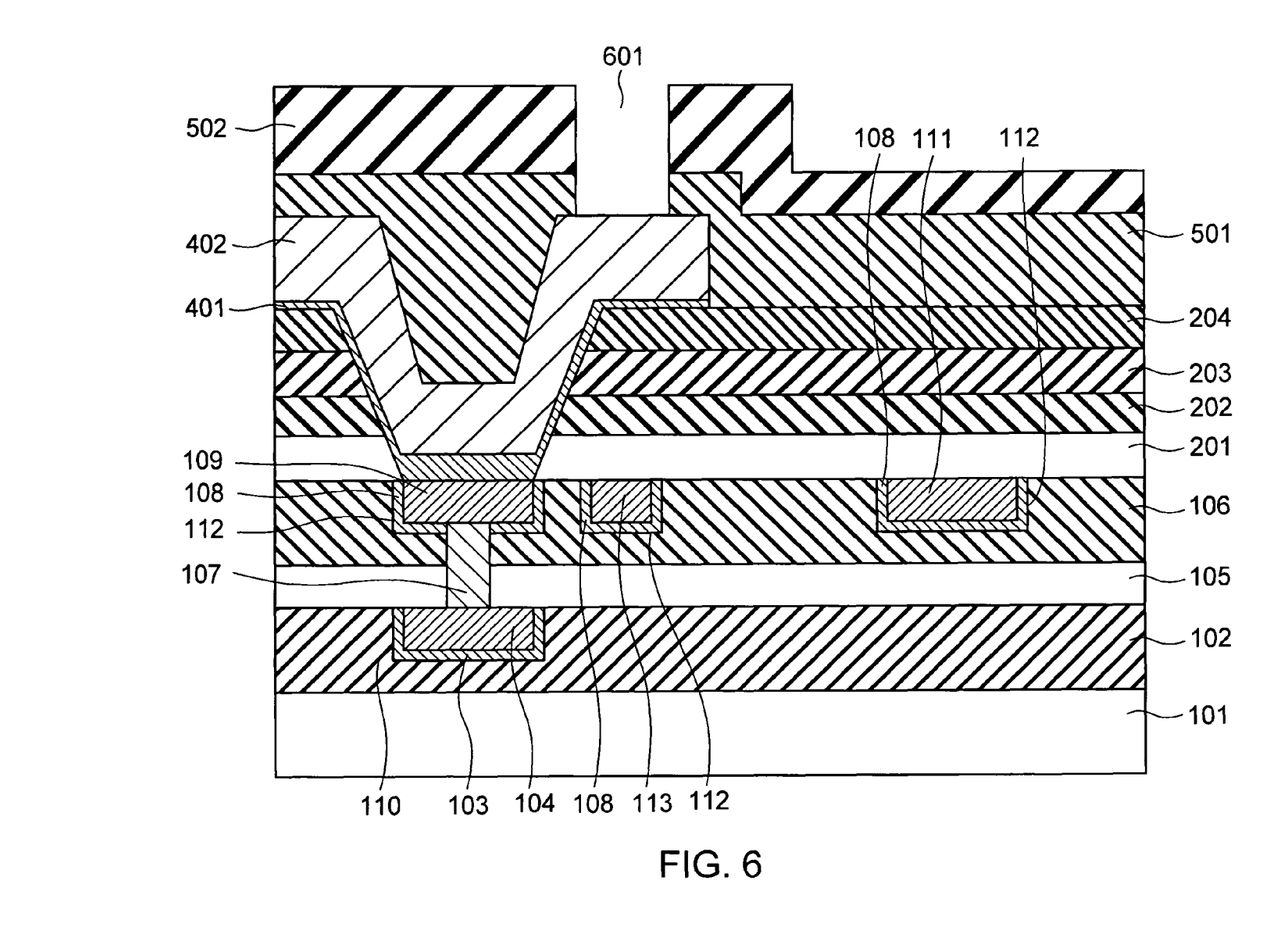
FIG. 6 illustrates a cross section showing a process subsequent to FIG. 5 of the method of manufacturing the semiconductor device according to the first embodiment of the present invention.

FIG. 6 illustrates a cross section showing a process subsequent to process step shown in FIG. 5 of the method of manufacturing the semiconductor device according to the first embodiment of the present invention.

Subsequent to FIG. 5, a resist pattern to expose the pad wire 402 is formed by photolithography. After that, the second and first over-pad-wire insulating films 502 and 501 are selectively removed by RIE, thereby forming a terminal via (TV) 601 from which the pad wire 402 is exposed. The area of the TV 601 is 50 μm×50 μm.

Figure 7:
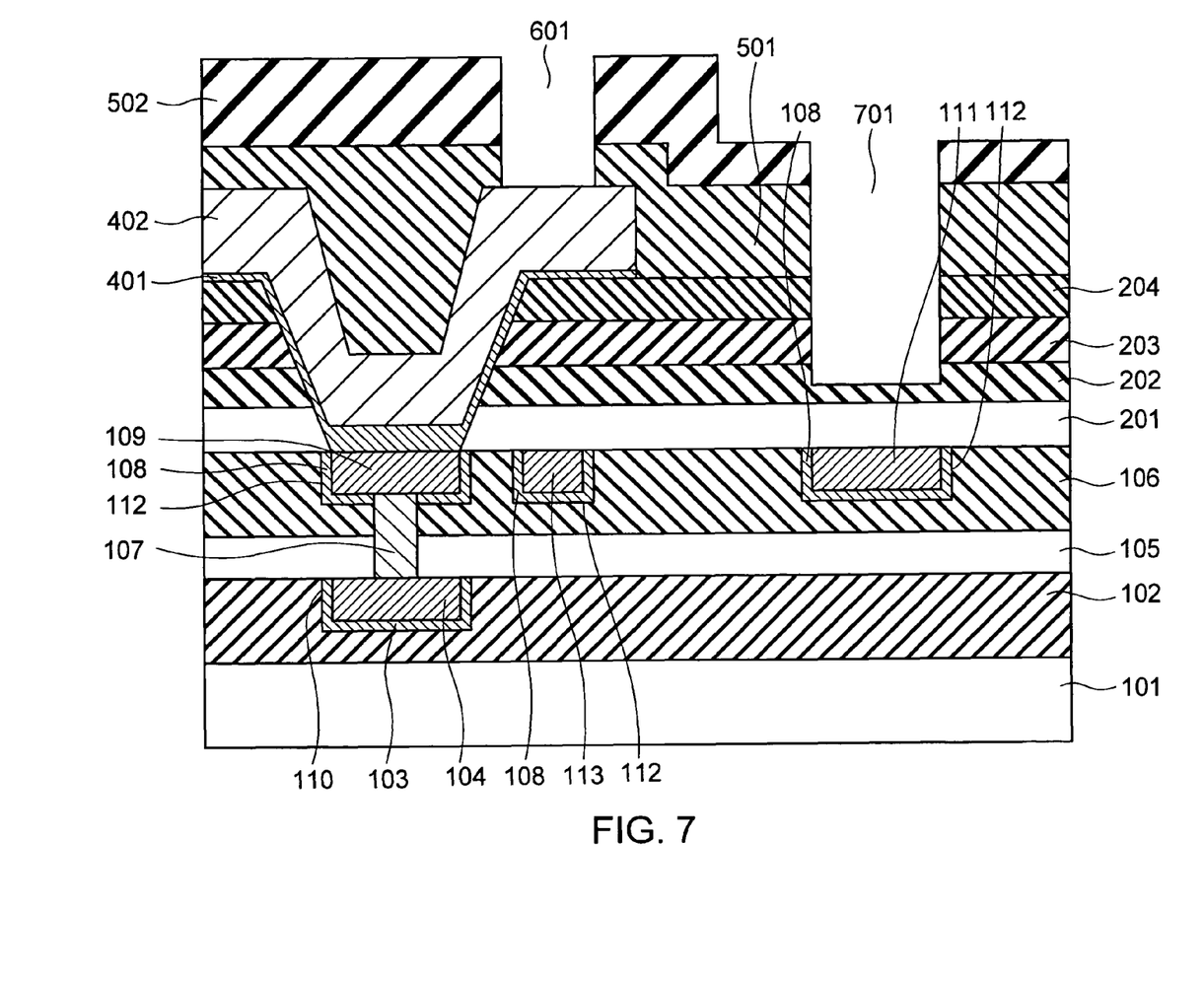
FIG. 7 illustrates a cross section showing a process subsequent to FIG. 6 of the method of manufacturing the semiconductor device according to the first embodiment of the present invention.

FIG. 7 illustrates a cross section showing a process subsequent to process step shown in FIG. 6 of the method of manufacturing the semiconductor device according to the first embodiment of the present invention.

Subsequent to FIG. 6, a resist pattern of a fuse window 701 is formed by photolithography. After that, the first over-pad-wire insulating film 501, the second over-pad-wire insulating film 502, the third under-pad-wire insulating film 204, the second under-pad-wire insulating film 203 and the first under-pad-wire insulating film 202 over the area of the fuse wire 111 are selectively removed. By controlling time of the RIE, the fuse window 701 is formed so as to leave a part of the first under-pad-wire insulating film 202. The area of the fuse window 701 is 100 μm×100 μm. The thickness of the remaining first under-pad-wire insulating film 202 is 0.2 to 0.4 μm. The TV 601 and the fuse window 701 may be formed simultaneously.

Figure 8:
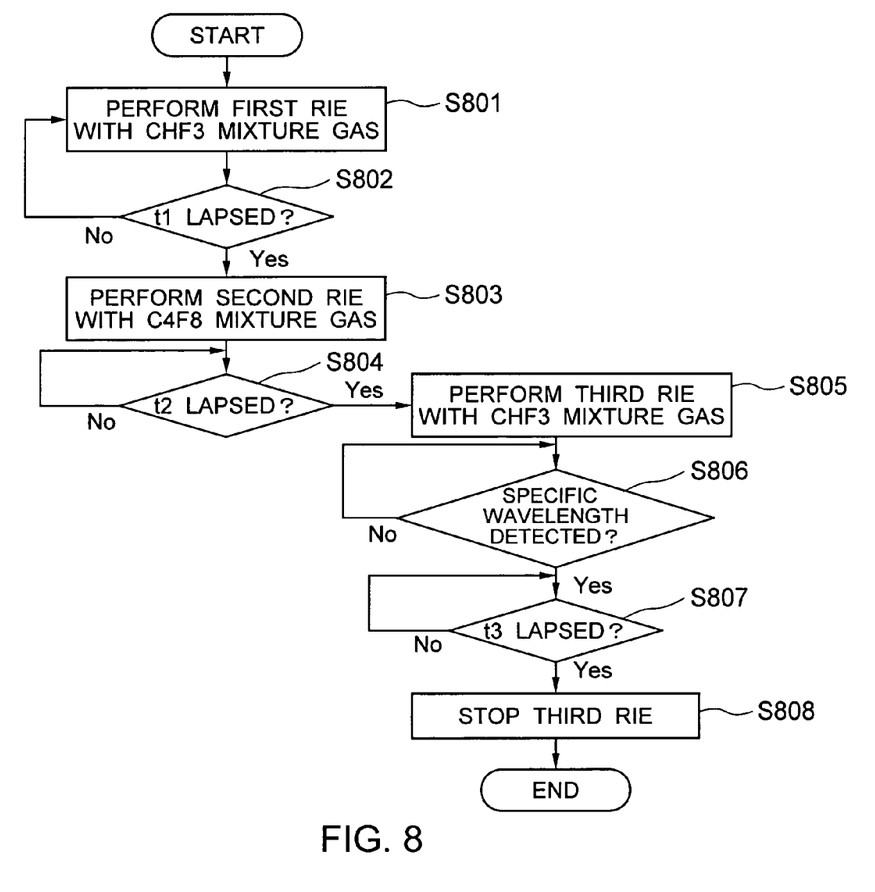
FIG. 8 illustrates a flowchart showing processes executed by a controller for controlling the RIE for forming the fuse window 701.

FIG. 8 illustrates a flowchart showing processes executed by a controller for controlling the RIE for forming the fuse window 701.

First, a condition such that "etching is performed for time $t_1$ with plasma of a $CHF_3$ mixture gas" is set, and first RIE for removing the second and first over-pad-wire insulating films 502 and 501 and the third under-pad-wire insulating film 204 is performed (S801).

When time required to remove the second over-pad-wire insulating film 502 is $t_{502}$, time required to remove the first over-pad-wire insulating film 501 is $t_{501}$ and time required to remove the third under-pad-wire insulating film 204 is $t_{204}$, $t_1$ is set so as to satisfy the relation of $t_{502}+t_{501}<t_1<t_{502}+t_{501}+t_{204}$.

After lapse of the time $t_1$ (Yes in S802), a condition such that "etching is performed for time $t_2$ with plasma of a $C_4F_8$ mixture gas" is set, and second RIE for removing the remaining third under-pad-wire insulating film 204 is performed (S803). When time required to remove the remaining third under-pad-wire insulating film 204 is $t_{204}^1$, $t_2$ is set so as to satisfy the relation of $0<t_2<t_{204}^1$.

Preferably, considering dispersions in the thickness of the remaining third under-pad-wire insulating film 204, $t_{204}^1$ is longer than the time required to remove the thinnest part (for example, about twice as long as time required to remove the thinnest part).

Since reaction in the second RIE using the plasma of the $C_4F_8$ mixture gas with SiN as the material of the second under-pad-wire insulating film 203 is weak, the rate of the second RIE in the interface between the third under-pad-wire insulating film 204 and the second under-pad-wire insulating film 203 becomes slow.

After lapse of the time $t_2$ (Yes in S804), a condition such that "etching is performed for time $t_3$ with plasma of a $CHF_3$ mixture gas after light having a predetermined wavelength emitting in a third RIE chamber is detected" is set, and third RIE for removing the second under-pad-wire insulating film 203 and the first under-pad-wire insulating film 202 is performed (S805). When time required to remove the first under-pad-wire insulating film 202 is $t_{202}$, $t_2$ is set so as to satisfy the relation of $0 \leq t_3 < t_{202}$. In the case where the material of the first under-pad-wire insulating film 202 is $SiO_2$, the specific wavelength is about 378 nm.

After time $t_3$ elapses since the light having the wavelength (specific wavelength) emitted from the first under-pad-wire insulating film 202 is detected (Yes in S806 and Yes in S807), the third RIE is stopped (S808).

The control of RIE shown in FIG. 8 can be also applied to formation of the contact hole 301 shown in FIG. 3.

In the first embodiment of the present invention, the time ($t_3$) of controlling the third RIE is short. Therefore, dispersions in the thickness of the remaining first under-pad-wire insulating film 202 can be suppressed to the range of 0.2 to 0.4 μm.

As a result, the influence on the cutting and removing is minimized by suppressed dispersions, and the fuse wire can be properly cut.

Further, since the film thickness can be reduced to 0.2 to 0.4 μm, the fuse wire can be properly cut in the whole surface of the wafer.

Since the second under-pad-wire insulating film 203 can be removed completely, at the time of cutting the fuse wire 111 with a laser beam, a crack does not occur in the insulating film around the fuse wire 111.

In the semiconductor device according to the first embodiment of the present invention, the repair ratio by a redundancy circuit was 97% or higher.

Although a device verification test was repeated ten times, no crack occurred between a needle mark in the bottom of the TV 601 and the conductor wire 113.

As a result, no failure caused by corrosion of the conductor wire 113 occurred in the hot and humid environment.

In a semiconductor chip after the device verification test, no failure occurred in a thermal cycle test (500 cycles) of −40° C. to 150° C.

First Comparative Example

A first comparative example will be described. Description similar to that of the first embodiment of the present invention will not be repeated.

Figure 9:
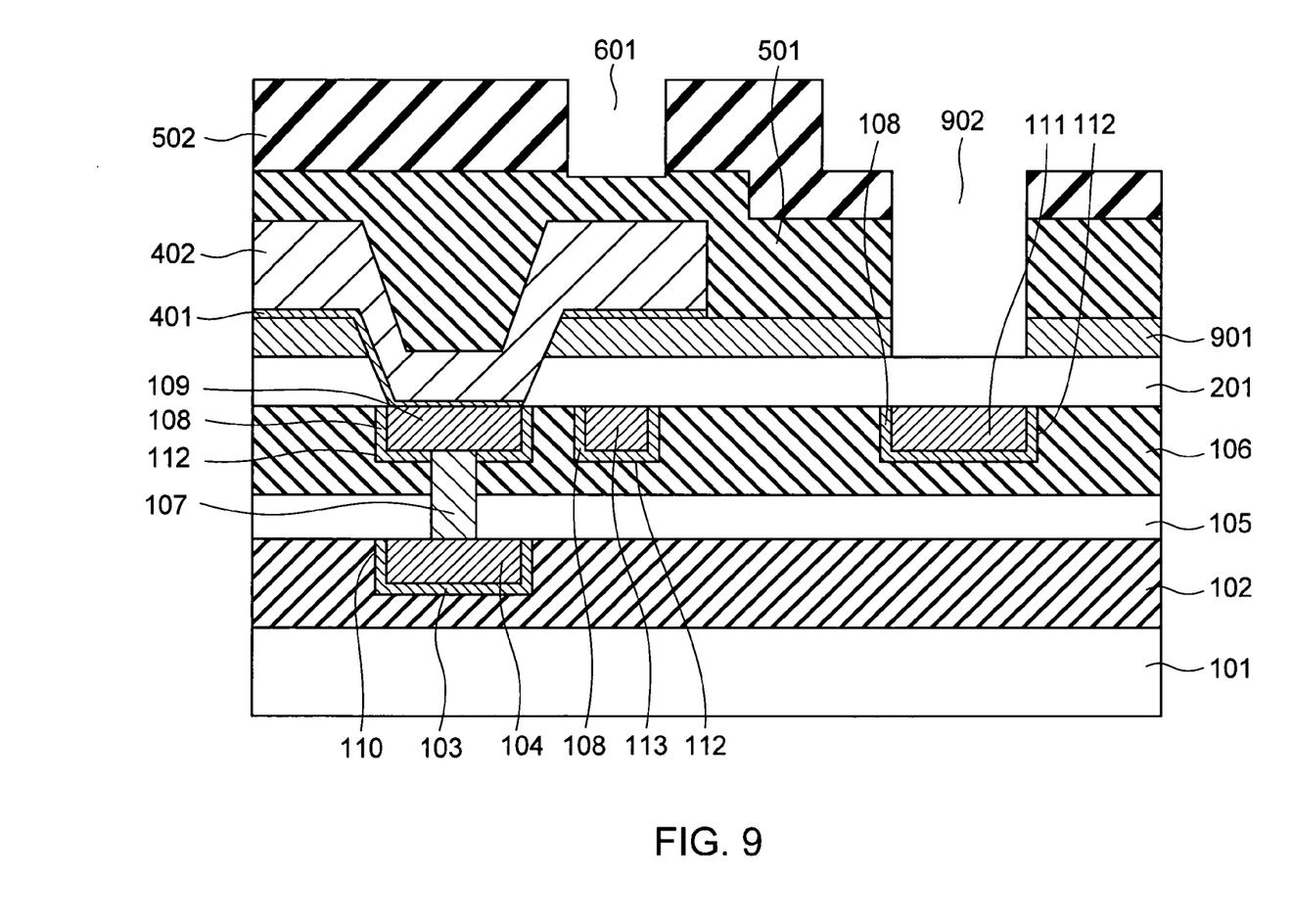
FIG. 9 illustrates a cross section of the semiconductor device according to the first comparative example.

FIG. 9 is a cross section of the semiconductor device according to the first comparative example.

In the first embodiment of the present invention, the number of under-pad-wire insulating films is three. In contrast, in the first comparative example, the number of the under-pad-wire insulating film is one, and the under-pad-wire insulating film is thinner than that of the first embodiment of the present invention.

An under-pad-wire insulating film 901 is a $SiO_2$ and has a thickness of 0.5 μm.

The barrier metal 401, the pad wire 402, the first over-pad-wire insulating film 501, the second over-pad-wire insulating film 502 and the TV 601 are formed.

By performing the processes in steps S801 to S804 shown in FIG. 8, a fuse window 902 is formed.

After lapse of time $t_2$, the second RIE is stopped.

As a result, the second stopper insulating film 201 is exposed.

In the first comparative example, water entered from the exposed second stopper insulating film 201, and the fuse wire 111 corroded.

After repeating a device verification test ten times, a crack occurred between a needle mark in the bottom of the TV 601 and the conductor wire 113. As a result, the conductor wire 113 corroded in the hot and humid environment, and a failure whose cause is estimated to be a crack which occurred in the device verification test also arises occurred.

A failure whose cause is estimated to be a crack which occurred in the device verification test also arises.

Second Comparative Example

A second comparative example will now be described. Description similar to that of the first embodiment of the present invention and the first comparative example will not be repeated.

Figure 10:
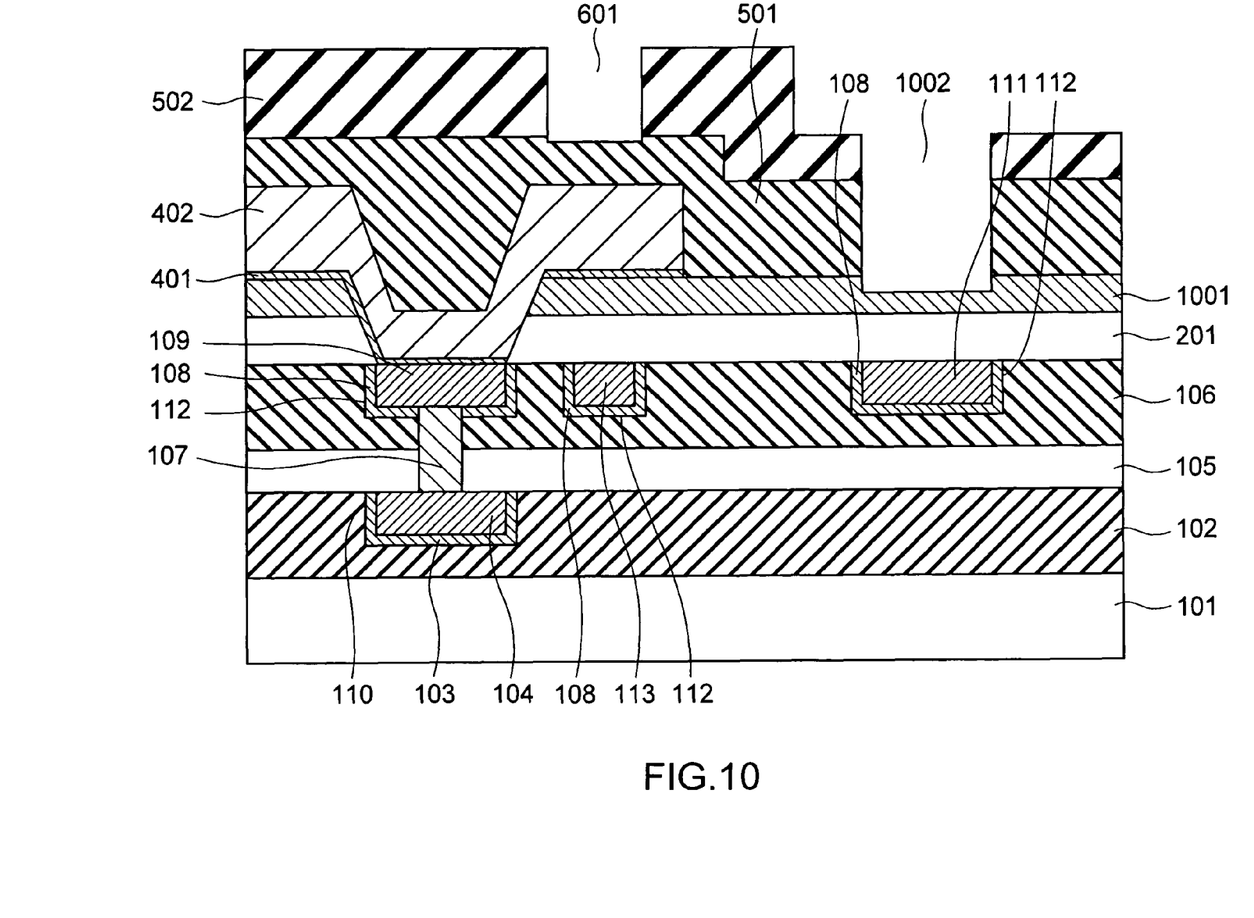
FIG. 10 illustrates a cross section of the semiconductor device according to the second comparative example.

FIG. 10 is a cross section of the semiconductor device according to the second comparative example.

In the first comparative example of the present invention, the second stopper insulating film 201 is exposed. In contrast, in the second comparative example, a part of the under-pad-wire insulating film remains, so that the second stopper insulating film 201 is not exposed.

An under-pad-wire insulating film 1001 is a $SiO_2$ film and has a thickness of 0.5 μm.

The barrier metal 401, the pad wire 402, the first over-pad-wire insulating film 501, the second over-pad-wire insulating film 502 and the TV 601 are formed.

Subsequently, by performing the processes in steps S801 and S802 shown in FIG. 8, a fuse window 1002 is formed.

After lapse of time $t_1$, the first RIE is stopped. $t_1$ is longer than $t_3$ in the first embodiment of the present invention.

As a result, dispersions in the thickness of the remaining under-pad-wire insulating film 1001 become 0.1 to 0.5 μm which is larger than that in the first embodiment of the present invention.

In the second comparative example, the repair ratio by the redundancy circuit was lower than that of the first embodiment of the present invention.

A failure whose cause is estimated to be a crack which occurred in the device verification test also arises. After repeating the device verification test about ten times, a crack occurred between a needle mark in the bottom of the TV 601 and the conductor wire 113.

As a result, the conductor wire 113 corroded in the hot and humid environment, and a failure occurred.

Third Comparative Example

A third comparative example will be described. Description similar to that of the first embodiment of the present invention will not be repeated.

Figure 11:
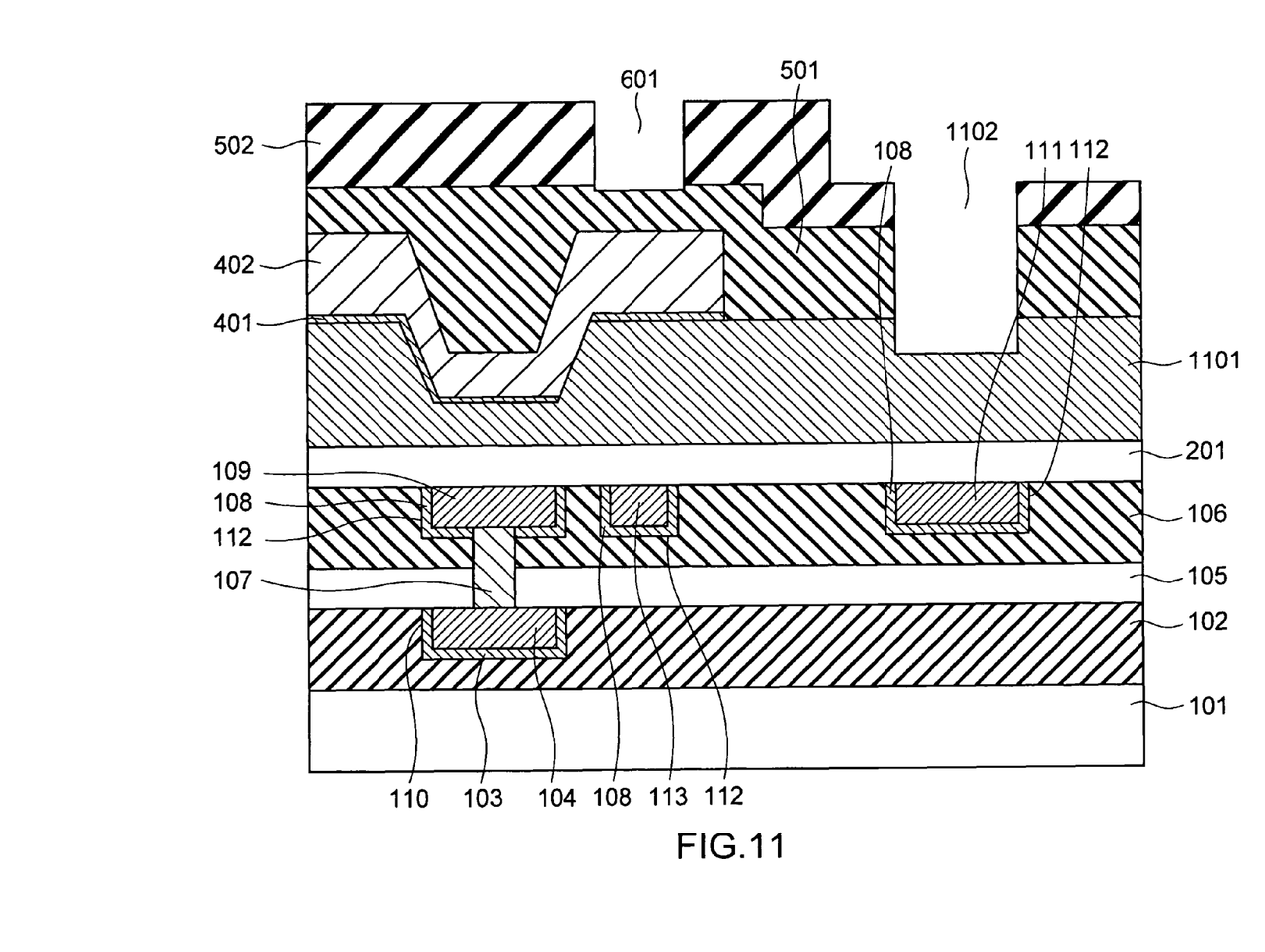
FIG. 11 illustrates a cross section of the semiconductor device according to the third comparative example.

FIG. 11 is a cross section of a semiconductor device of a third comparative example.

In the third comparative example, the under-pad-wire insulating film is thicker than that of the first and second comparative examples.

An under-pad-wire insulating film 1101 is an $SiO_2$ film and has a thickness of 1.7 μm.

The barrier metal 401, the pad wire 402, the first over-pad-wire insulating film 501, the second over-pad-wire insulating film 502 and the TV 601 are formed.

Subsequently, by performing the processes in steps S801 and S802 shown in FIG. 8, a fuse window 1102 is formed.

$t_1$ is set so that a part of the under-pad-wire insulating film 1001 remains.

However, $t_1$ of the third comparative example is longer than that of the second comparative example, so that dispersions in the thickness of the remaining under-pad-wire insulating film 1101 become 0.1 to 0.7 μm which is larger than that in the first embodiment of the present invention and the second comparative example.

In the third comparative example, the device verification test was repeated by about 10 times, and no crack occurred between a needle mark in the bottom of the TV 601 and the conductor wire 113.

As a result, a failure caused by corrosion of the conductor wire 113 did not occur in the hot and humid environment. However, the repair ratio by the repair circuit was lower than that of the second comparative example.

What is claimed is:

1. A semiconductor device comprising:
    a semiconductor substrate;
    at least one insulating film formed on the semiconductor substrate;
    a conductor wire and a fuse wire formed in the insulating film;
    a stopper insulating film on the insulating film;
    a first under-pad-wire insulating film formed on the stopper insulating film;
    a second under-pad-wire insulating film formed on the first under-pad-wire insulating film and comprising an element different from an element of the first under-pad-wire insulating film;
    a pad wire formed in an area above the conductor wire and in the first under-pad-wire insulating film and the second under-pad-wire insulating film; and
    an opening formed in a part of the first under-pad-wire insulating film and a part of the second under-pad-wire insulating film and exposing a top surface of the first under-pad-wire insulating film in an area above the fuse wire.

2. The semiconductor device according to claim 1, wherein the first under-pad-wire insulating film comprises $SiO_2$, SiN, $SiH_4$, SiC, SiCN, SiCH, SiOC, SiOCH or polyallyl ether (PAE).

3. The semiconductor device according to claim 1, wherein the second under-pad-wire insulating film comprises $SiO_2$, SiN, $SiH_4$, SiC, SiCN, SiCH, SiOC, SiOCH or polyallyl ether (PAE), which is different from that of the first under-pad-wire insulating film.

4. The semiconductor device according to claim 1, wherein the conductor wire comprises at least one of Cu, Al, Sn, Pb, Ag, Mn and W.

5. The semiconductor device according to claim 1, further comprising a third under-pad-wire insulating film formed between the second under-pad-wire insulating film and the pad wire,
    wherein the third under-pad-wire insulating film comprises an element different from that of the second under-pad-wire insulating film.

6. The semiconductor device according to claim 5, wherein the third under-pad-wire insulating film comprises $SiO_2$, SiN, $SiH_4$, SiC, SiCN, SiCH, SiOC, SiOCH or polyallyl ether (PAE), which is different from the material of the second under-pad-wire insulating film.

* * * * *